United States Patent
Oh et al.

(10) Patent No.: US 9,443,898 B2
(45) Date of Patent: Sep. 13, 2016

(54) IMAGE SENSORS HAVING REDUCED INTERFERENCE BETWEEN PIXELS

(71) Applicant: Samsung Electronics Co., Ltd., Suwon-si, Gyeonggi-do (KR)

(72) Inventors: Young-Sun Oh, Yongin-si (KR); Yi-Tae Kim, Hwaseong-si (KR); Jung-Chak Ahn, Yongin-si (KR); Kyung-Ho Lee, Suwon-si (KR); Jun-Suk Lee, Seoul (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 14/595,336

(22) Filed: Jan. 13, 2015

(65) Prior Publication Data

US 2015/0333091 A1 Nov. 19, 2015

(30) Foreign Application Priority Data

May 14, 2014 (KR) .................. 10-2014-0058005

(51) Int. Cl.
*H01L 29/49* (2006.01)
*H01L 27/146* (2006.01)
*H04N 5/357* (2011.01)
*H04N 5/3745* (2011.01)

(52) U.S. Cl.
CPC ... *H01L 27/14641* (2013.01); *H01L 27/14603* (2013.01); *H04N 5/357* (2013.01); *H04N 5/3745* (2013.01); *H04N 5/37457* (2013.01)

(58) Field of Classification Search
CPC .............................................. H01L 27/14603
See application file for complete search history.

(56) References Cited

U.S. PATENT DOCUMENTS

| | | | |
|---|---|---|---|
| 2004/0005729 A1* | 1/2004 | Abe | H01L 23/544 438/48 |
| 2007/0158713 A1* | 7/2007 | Ohkawa | H01L 27/14603 257/292 |
| 2008/0055729 A1 | 3/2008 | Li et al. | |
| 2009/0053848 A1* | 2/2009 | Fan | H01L 27/14603 438/59 |
| 2010/0157116 A1 | 6/2010 | Kikuchi | |
| 2013/0049082 A1 | 2/2013 | Kato et al. | |
| 2013/0056617 A1* | 3/2013 | Massetti | H01L 27/14603 250/208.1 |
| 2015/0001377 A1* | 1/2015 | Tazoe | H01L 31/18 250/208.1 |
| 2015/0001589 A1* | 1/2015 | Tazoe | H01L 27/14603 257/229 |

FOREIGN PATENT DOCUMENTS

JP 2008-186894 8/2008

OTHER PUBLICATIONS

Tanaka et al. "A ½.5-inch 8Mpixel CMOS Image Sensor with a Staggered Shared-Pixel Architecture and an FD-Boost Operation" *IEEE International Solid-State Circuits Conference* Session 2, Imagers, 2.4:44-46 (2009).

* cited by examiner

Primary Examiner — Michael Shingleton
(74) Attorney, Agent, or Firm — Myers Bigel & Sibley, P.A.

(57) ABSTRACT

An image sensor includes first pixels and a first source follower transistor, which are disposed adjacent to each other in a first pixel area in a column direction, and second pixels and a second source follower transistor, which are formed in a second pixel area adjacent to the first pixel area in a row direction by the same number of the first pixels, wherein when the first pixels share the first source follower transistor and the second pixels share the second source follower transistor, while pixels selected from the same row are activated, the first source follower transistor and the second source follower transistor being activated are disposed so that locations thereof have a diagonal symmetry.

14 Claims, 10 Drawing Sheets

IMAGE SENSORS HAVING REDUCED INTERFERENCE BETWEEN PIXELS

CROSS-REFERENCE TO RELATED APPLICATION

This application claims priority under 35 U.S.C. §119 to Korean Patent Application No. 10-2014-0058005 filed on May 14, 2014, the disclosure of which is incorporated by reference herein in its entirety.

BACKGROUND

1. Field

Embodiments of the inventive concepts relate to image sensors and, more particularly, to image sensors that may exhibit reduced parasitic capacitance between the drive circuits for pixels of the image sensor by positioning transistors thereof in a manner that reduces interference.

2. Description of Related Art

Image sensors are a well-known type of semiconductor device that convert an optical image into an electrical signal using a light-sensitive characteristic of the semiconductor material. In general, image sensors may be classified into charge coupled devices (CCD) and CMOS image sensors (CIS).

The two primary components of a typical image sensor are (1) a pixel array that includes a matrix structure in which a plurality of rows and columns of pixels are disposed and (2) a converter that converts the output from the pixel array. That is, when the pixel array senses an optical image and outputs an analog voltage, the converter converts the sensed analog voltage into a digital value and performs subsequent processing.

SUMMARY

Embodiments of the inventive concepts provide an image sensor in which a disposition of transistors is simple, and interference between pixel drive circuits may be reduced.

In accordance with an aspect of the inventive concepts, an image sensor includes a first column of pixels that includes a first pixel and a second pixel that are adjacent each other in a column direction, a first source follower transistor that is shared by the first pixel and the second pixel, a second column of pixels that includes a third pixel and a fourth pixel that are adjacent each other in the column direction, the second column of pixels being adjacent the first column of pixels so that the first and third pixels form a first row in a row direction that is substantially perpendicular to the column direction and the second and fourth pixels form a second row in the row direction, and a second source follower transistor that is shared by the third pixel and the fourth pixel, wherein the first source follower transistor is diagonally spaced apart from the second source follower transistor with respect to an array defined by the first and second rows and the first and second columns.

In an embodiment, the first source follower transistor may be disposed below the second pixel, and the second source follower transistor may be disposed above the third pixel. In another embodiment, the first source follower transistor may be disposed above the first pixel, and the second source follower transistor may be disposed below the fourth pixel.

In some embodiments, a first floating diffusion area that may be between the first pixel and the second pixel. In such embodiments, the first source follower transistor may be electrically connected to the first floating diffusion area.

In some embodiments, a second floating diffusion area may be included between the third pixel and the fourth pixel. In such embodiments, the second source follower transistor may be electrically connected to the second floating diffusion area.

In accordance with another aspect of the inventive concepts, an image sensor includes a first pixel and a second pixel which are sequentially disposed in a first column that extends in a column direction, a third pixel and a fourth pixel which are sequentially disposed in a second column that extends in the column direction, where the first pixel is directly adjacent the third pixel in a first row that extends in a row direction that is substantially perpendicular to the column direction, and the second pixel is directly adjacent the fourth pixel in a second row that extends in the row direction. A first source follower transistor is provided in the first column that is positioned above both the first pixel and the second pixel, a second source follower transistor is provided in the first column that is positioned below both the first pixel and the second pixel, a third source follower transistor is provided in the second column that is positioned above both the third pixel and the fourth pixel, and a fourth source follower transistor is provided in the second column that is positioned below both the third pixel and the fourth pixel, wherein the first and third source follower transistors are connected so that driving times thereof are differently controlled and the second and fourth source follower transistors are connected so that driving times thereof are differently controlled.

In an embodiment, when either the first pixel or the second pixel is activated, the first source follower transistor may be activated, and when either the third pixel or the fourth pixel is activated, the fourth source follower transistor may be activated. In such embodiments, the first pixel and the second pixel may be connected to share the first source follower transistor, and the third pixel and the fourth pixel may be connected to share the fourth source follower transistor.

In yet another embodiment, when either of the first pixel or the second pixel is activated, the second source follower transistor may be activated, and when either the third pixel or the fourth pixel is activated, the third source follower transistor may be activated. In such embodiments, the first pixel and the second pixel may be connected to share the second source follower transistor, and the third pixel and the fourth pixel may be connected to share the third source follower transistor.

In yet another embodiment, when pixels selected from the same row are activated, the ones of the first through fourth source follower transistors that are activated may be disposed so that locations thereof have a diagonal symmetry.

In accordance with another aspect of the inventive concepts, an image sensor includes a pixel array that has a plurality of pixels arranged in rows and columns and a plurality of source follower transistors, each of which is associated with one or more of the pixels. Ones of the source follower transistors that are associated with pixels in odd columns of a first of the rows are below the pixels in the first of the rows and ones of the source follower transistors that are associated with pixels in even columns of the first of the rows are above the pixels in the first of the rows.

In some embodiments, each source follower transistor may be associated with a pair of pixels, and the image sensor may further include a plurality of floating diffusion areas, each of which is between the two pixels of the respective pairs of pixels. Respective ones of a plurality of conductive lines may connect each source follower transistor to a respective one of the floating diffusion areas.

In some embodiments, the conductive lines of may only cross pixels in odd columns of the first row and the conductive lines may only cross pixels in even columns of a second row that is directly below the first row.

In yet another embodiment, the plurality of conductive lines may be arranged in a diagonal pattern.

In an embodiment, each source follower transistor may be associated with a respective one of the pixels, and each pixel may further include an associated floating diffusion area and a transfer transistor coupled between the floating diffusion area and the respective pixel. The transfer transistor and the floating diffusion area may be below their associated pixels in odd columns of the pixel array and may be above their associated pixels in even columns of the pixel array. In such embodiments, a pixel drive circuit for the pixel array may have a 4T pixel structure that includes four transistors for each pixel.

BRIEF DESCRIPTION OF THE DRAWINGS

The foregoing and other features and advantages of the inventive concepts will be apparent from the following description of example embodiments of the inventive concepts, which are illustrated in the accompanying drawings. The drawings are not necessarily to scale, emphasis instead being placed upon illustrating the principles of the inventive concepts. In the drawings.

DETAILED DESCRIPTION OF THE EMBODIMENTS

Figure 1:
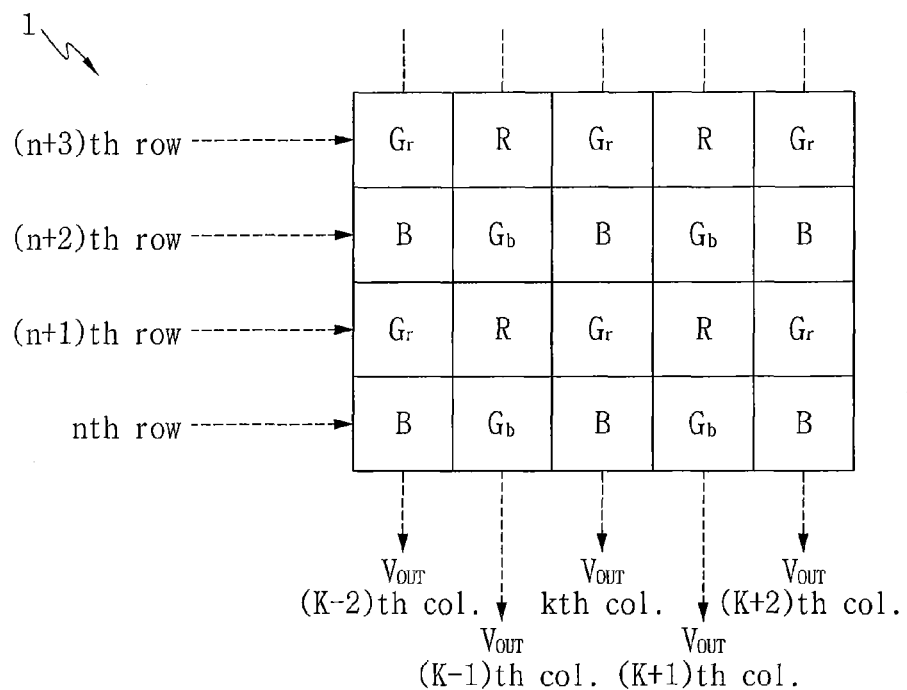
FIG. 1 is a schematic block diagram illustrating a color filter pattern of a pixel array of an image sensor.

Hereinafter, example embodiments of the inventive concepts are described with reference to the accompanying drawings. In the description that follows, detailed explanation of well-known configurations may be omitted. In this specification, like reference numerals refer to like items.

Particular structural or functional descriptions for embodiments disclosed in this specification are only for the purpose of description of the embodiments of the inventive concepts. The embodiments of the inventive concepts may be varied in many ways without departing from the scope of the inventive concepts, and hence it will be appreciated that the inventive concepts are not limited to the example embodiments that are described in detail in this specification.

While the inventive concepts are susceptible to various modifications and alternative forms, specific embodiments thereof are shown by way of example in the drawings and will herein be described in detail. It should be understood, however, that there is no intent to limit the inventive concepts to the particular forms disclosed, but on the contrary, the inventive concepts cover all modifications, equivalents, and alternatives falling within the spirit and scope of the inventive concepts.

It will be understood that, although the terms "first," "second," etc., may be used herein to describe various elements, these elements are not be limited by these terms. These terms are only used to distinguish one element from another. For example, a first element could be termed a second element, and similarly, a second element could be termed a first element, without departing from the scope of the inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the inventive concepts will be described in detail with reference to the accompanying drawings.

FIG. 1 is a schematic block diagram illustrating a color filter pattern of a pixel array 1 of an image sensor.

Referring to FIG. 1, a color filter is disposed on the pixel array 1. The color filter includes four types of filters which each only pass light of a specific color, namely a red R filter, a green Gr filter, a green Gb filter, and a blue B filter. Each filter may overlap a pixel of an image sensor, and filter captured light according to a wavelength of each color.

The pixel array 1 shown in FIG. 1 is a Bayer pattern, and is configured as an element of 50% green, 25% red, and 25% blue.

The pixel array 1 is arranged in a pattern in which filters for the colors R and Gr are in a first row, and filter for the colors of Gb and B are in a second row that is directly adjacent the first row. This pattern is maintained throughout the pixel array 1. As filters for the colors Gr and Gb, which are closely related to a luminance signal, are disposed in all rows, luminance resolution is increased. The filters for the color R and the color B are disposed in a zigzag shape in the column direction of the pixel array 1. Throughout the pixel array 1, filters for the colors B and Gb are regularly disposed in an $n^{th}$ row, and filters for the colors Gr and R are regularly disposed in an $(n+1)^{th}$ row and in an $(n-1)^{th}$ row.

When a row is selected, pixels in the row may be selected, and an output voltage $V_{out}$ is supplied through each of columns $(K-2)^{th}$ to $(K+2)^{th}$. The output voltage $V_{out}$ of each selected pixel may be displayed in various colors through the filter.

Figure 2:
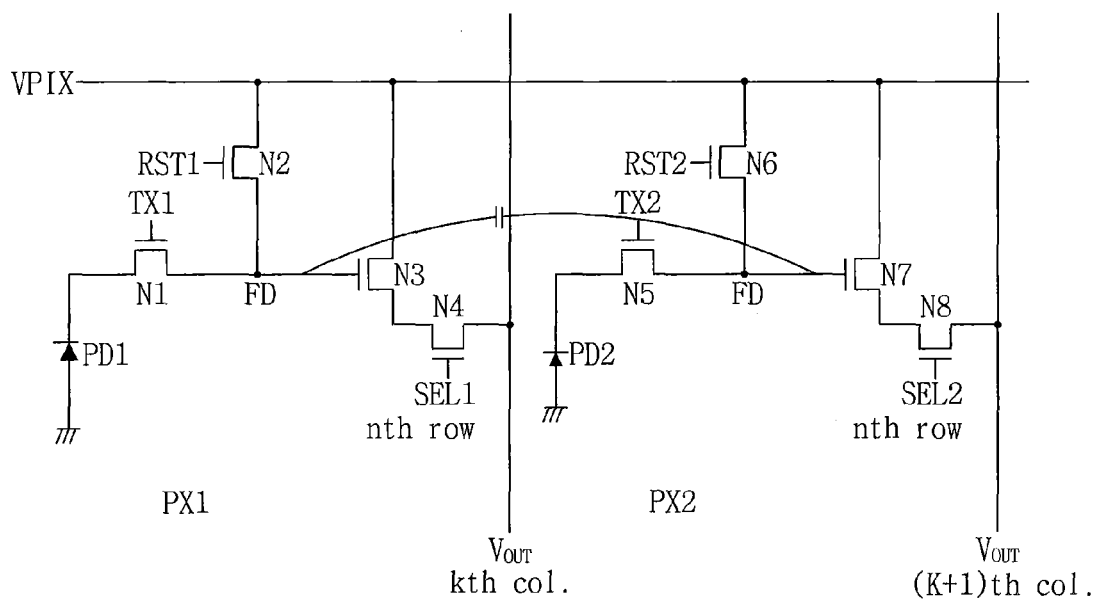
FIG. 2 is a circuit diagram illustrating two pixels and their associated drive circuitry that may be used in the pixel array of FIG. 1.

FIG. 2 is a circuit diagram showing two pixels and their associated drive circuit 2 which may be used in the pixel array 1 of FIG. 1.

The disclosed pixel drive circuit 2 has a 4T (4 transistors for each pixel) structure. Each pixel includes a photoelectric conversion element such as, for example, a photo diode.

Referring to FIG. 2, the drive circuit for the first pixel PX1 includes four transistors N1 to N4, and the drive circuit for the second pixel PX2 includes four transistors N5 to N8. The first pixel PX1 includes a first photo diode PD1 and second pixel PX2 includes a second photo diode PD2.

The first photo diode PD1 of the first pixel PX1 photoelectrically converts incident light to a number of electrons corresponding to an amount of light. Here, while the photo diode is exemplified as the first photo diode PD1, the photo diode may include at least one of a photo transistor, a photo gate, a pinned photo diode (PPD), and a combination thereof.

A transfer transistor N1 is electrically coupled between the first photo diode PD1 and a floating diffusion area FD. When a drive signal TX1 is applied, the transfer transistor N1 turns on, and passes the electrons that were photoelectrically converted by the first photo diode PD1 to the floating diffusion area FD.

A reset transistor N2 is electrically coupled between a pixel power line VPIX and the floating diffusion area FD. The reset transistor N2 is controlled by a first reset control signal RST1, and resets an electric potential of the floating diffusion area FD as the potential of the pixel power line VPIX.

An amplifying transistor N3 is electrically coupled to the floating diffusion area FD, and constitutes a source follower with a selection transistor N4. Thus, the amplifying transistor N3 is referred to as a source follower transistor.

The selection transistor N4 is controlled by a first selection signal SEL1, and is electrically coupled to the amplifying transistor N3. When the first selection signal SEL1 is activated, the selection transistor N4 is turned on, and the photoelectrically converted electrons of the first photo diode PD1 are amplified through the amplifying transistor N3, and an output voltage $V_{out}$ may be supplied to the $K^{th}$ column.

Since the configuration and operation of the second pixel PX2 and the drive circuit therefore are similar to those of the first pixel PX1 and its drive circuit, repeated descriptions thereof are omitted.

An analog voltage that is generated in response to light that is received by each pixel in the pixel array is converted into a digital value and processed according to a subsequent operation.

In order to provide enhanced resolution, it may be desirable to reduce the size of the pixel array. As a result, the distance between elements of adjacent pixels (and their drive circuits) is reduced. As these distances are reduced, the effects of parasitic capacitance between such elements increases, and the parasitic capacitance may be increased by a coupling effect between the pixels (see FIG. 2). Therefore, the output voltage of a pixel may be distorted by interference between adjacent pixels, and this distortion may distort the colors of a captured image that are displayed, for example, on a screen. As described in FIG. 1, adjacent pixels in a selected row have different color filters. Thus, since the pixel is more sensitive to a signal of the adjacent pixel in the case of a wide dynamic range (WDR) mode or a higher gain mode of a multimedia device, reducing the interference influence between the pixels may be desirable.

Figure 3:
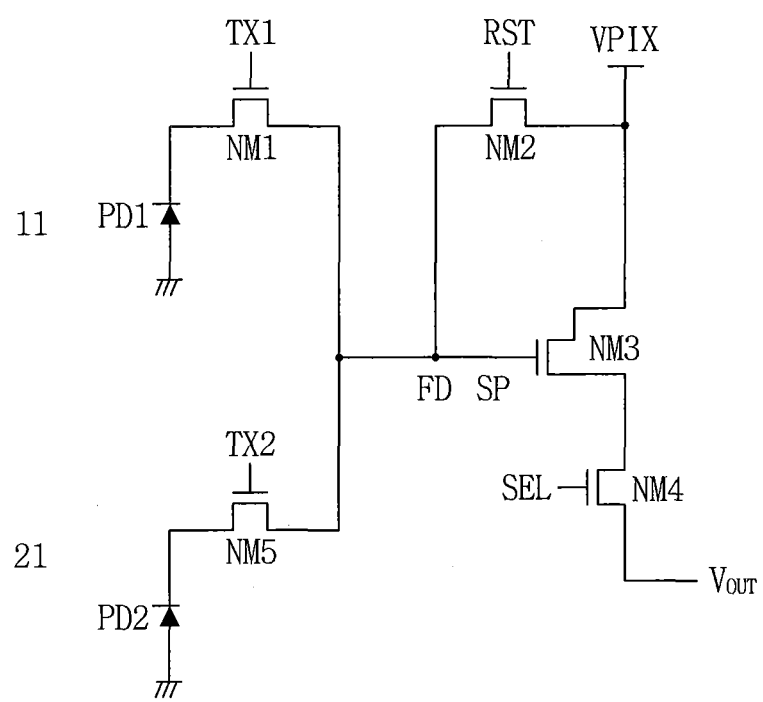
FIG. 3 is a circuit diagram illustrating two pixels and their associated drive circuitry that has a 4T-2 shared pixel structure.

FIG. 3 is a circuit diagram illustrating two pixels and their associated drive circuit, which has a 4T-2 shared pixel structure.

Referring to FIG. 3, in the pixel drive circuit having the 4T-2 shared pixel structure, each pixel 11, 21 includes a respective photo diode PD1, PD2. A transfer transistor is coupled to the photo diode. The remaining transistors of the drive circuit are shared by the two pixels 11, 21.

The drive circuit for the first and second pixels 11, 21 includes a first transfer transistor NM1, a reset transistor NM2, a second transfer transistor NM5, a source follower transistor NM3, and a selection transistor NM4.

The first transfer transistor NM1 is coupled to the first photo diode PD1, and controlled by a first drive signal TX1.

The reset transistor NM2 is disposed between a floating diffusion area FD and a pixel power line VPIX, and is controlled by a reset signal RST.

The second transfer transistor NM5 is coupled to the second photo diode PD2, and controlled by a second drive signal TX2.

The source follower transistor NM3 is controlled by the voltage of the floating diffusion area FD, and constitutes a source follower with the selection transistor NM4.

The selection transistor NM4 is controlled by a selection signal SEL, is electrically coupled to the source follower transistor NM3, and supplies an output voltage $V_{out}$.

The vertically disposed pixels 11 and 21 may share a floating diffusion area FD. Although the pixels 11, 21 are connected to different rows, signals photoelectrically converted from the photo diodes PD1 and PD2 may be transferred using the transfer transistors NM1 and NM5 respectively, and the selection transistor NM4, the source follower transistor NM3, and the reset transistor NM2 may be shared and controlled by a common signal. Thus, since the number of the transistors of the pixel drive circuit is decreased when the pixel drive circuit has the 4T-2 shared pixel structure, a size of the drive circuitry may be reduced.

Figure 4:
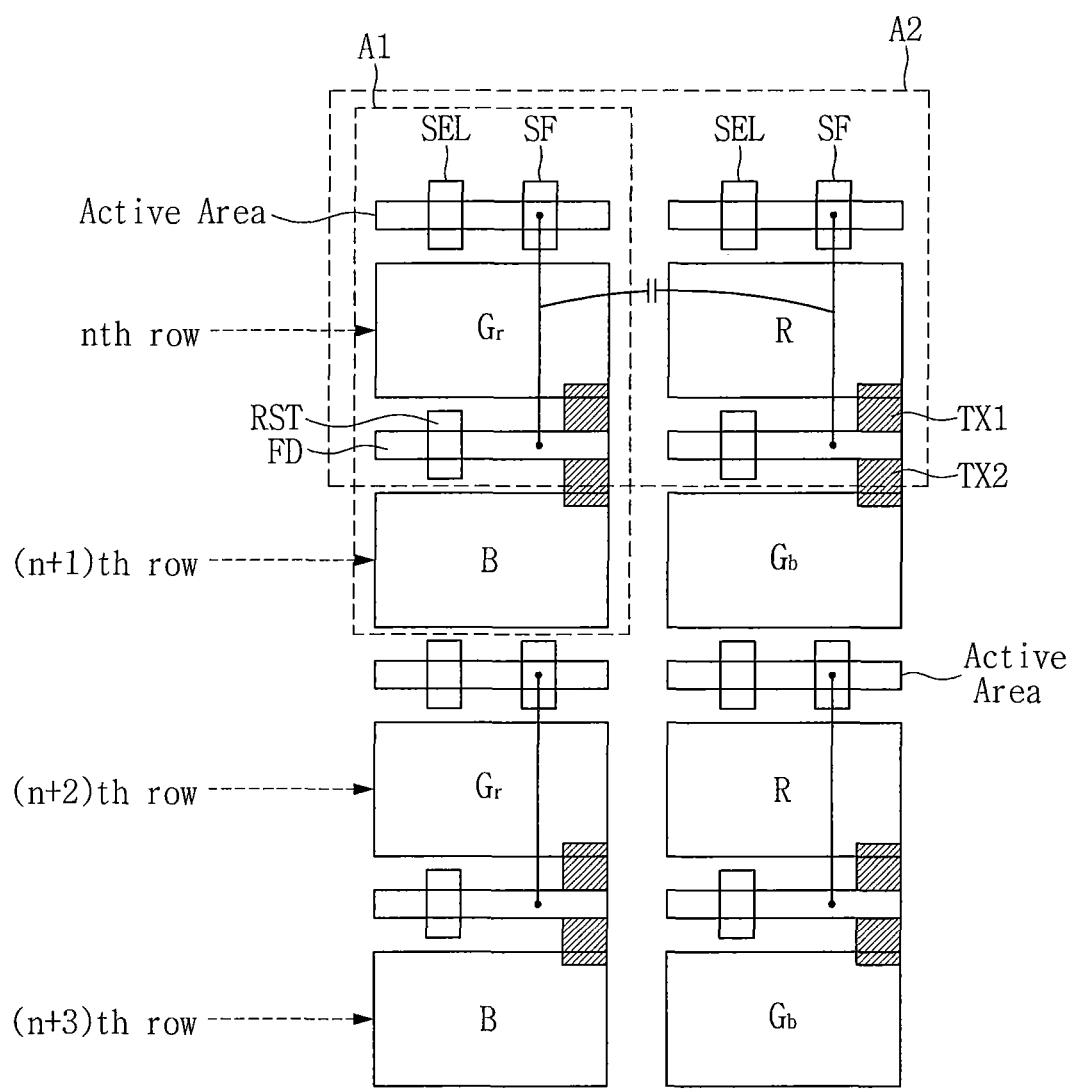
FIG. 4 is a plan view illustrating a layout of a pixel array and drive circuit that has the 4T-2 shared pixel structure of FIG. 3.

FIG. 4 is a plan view illustrating a layout of a pixel array and drive circuit that has the 4T-2 shared pixel structure of FIG. 3.

Referring to FIG. 4, a plurality of pixels are disposed in a matrix of rows and columns of pixels. The pixels shown in FIG. 4 may be repeated in the row and column direction to form a much larger array than is shown.

In the description below, a gate of the transistor to which the selection signal SEL (shown in FIG. 3) is applied is referred to as a selection transistor SEL, a gate of the source follower transistor to which the signal of the floating diffusion area FD is applied is referred to as a source follower transistor SF, a gate of the reset transistor to which the reset signal RST (shown in FIG. 3) is applied is referred to as a reset transistor RST, and gates of the first and second transfer transistors to which the respective first and second drive signals TX1 and TX2 (shown in FIG. 3) are applied are referred to as transfer transistors TX1 and TX2, respectively.

Referring to a region that is designated as "A1" in FIG. 4, a Gr pixel is disposed in an nth row of the pixel array and a B pixel is disposed in an $(n+1)^{th}$ row of the pixel array. The selection transistor SEL and the source follower transistor SF, which are formed in an active area, are disposed above the Gr pixel. Herein a first element in a column is referred to as being "above" a second element in the column if the first element is closer to the top of the column; likewise a first element in a column is referred to as being "below" a second element in the column if the first element is closer to the bottom of the column. The floating diffusion area FD is formed in an area interposed between the Gr pixel and the B pixel, and the reset transistor RST is disposed in the floating diffusion area FD. In the depicted embodiment, the Gr pixel and the B pixel overlap the first transfer transistor TX1 and the second transfer transistor TX2, respectively. However, it will be appreciated that embodiments of the inventive concepts are not limited to this configuration and that the Gr pixel and the B pixel need not necessarily overlap the respective first and second transfer transistors TX1 and TX2. The first transfer transistor TX1 and the second transfer transistor TX2 are connected to the floating diffusion area FD. The Gr pixel and the B pixel are disposed in the same column but in different rows. The source follower transistor SF is electrically connected to the floating diffusion area FD by a conductive (e.g., metal) wiring.

A Gr pixel and a B pixel in rows $(n+2)^{th}$ row and $(n+3)^{th}$ row have the same arrangement as the above-described structure.

Referring now to the region designated "A2" in FIG. 4, the above-described Gr pixel and an R pixel are disposed in the $n^{th}$ row.

A selection transistor SEL and a source follower transistor SF are disposed above each pixel. The floating diffusion area FD and the reset transistor RST are disposed below each pixel. The first transfer transistor TX1 in the left column overlaps the Gr pixel, and the first transfer transistor TX1 in the right column overlaps the R pixel.

The above-described structure is vertically and symmetrically disposed row by row. In addition, the structure is horizontally and symmetrically disposed column by column. In other words, the structure illustrated in FIG. 4 repeats in both the vertical and horizontal directions to form the pixel array.

The pixel drive circuit having the conventional structure of FIG. 4 may operate as follows. The $n^{th}$ row may be selected, and the Gr pixel and the R pixel may be activated. Optical signals capture by the Gr pixel and the R pixel may be photoelectrically converted and transferred through the transfer transistors TX1 that are associated with each pixel, and the transferred signals may charge the respective floating diffusion areas FD for the pixels. Continuously, signals amplified through the source follower transistors SF may be output through the selection transistors SEL.

Unfortunately, interference between the Gr and R pixels may occur if a distance between the adjacent pixels Gr and R is small. Specifically, since a distance between the conductive wirings, which connect the floating diffusion areas FD of each pixel to the source follower transistor SF of the pixel, is small, and since the area where these metal wiring overlap may be large, a parasitic capacitance may arise between the conductive wirings of the drive circuits for adjacent pixels. This parasitic capacitance may distort the pixel voltages.

Figure 5:
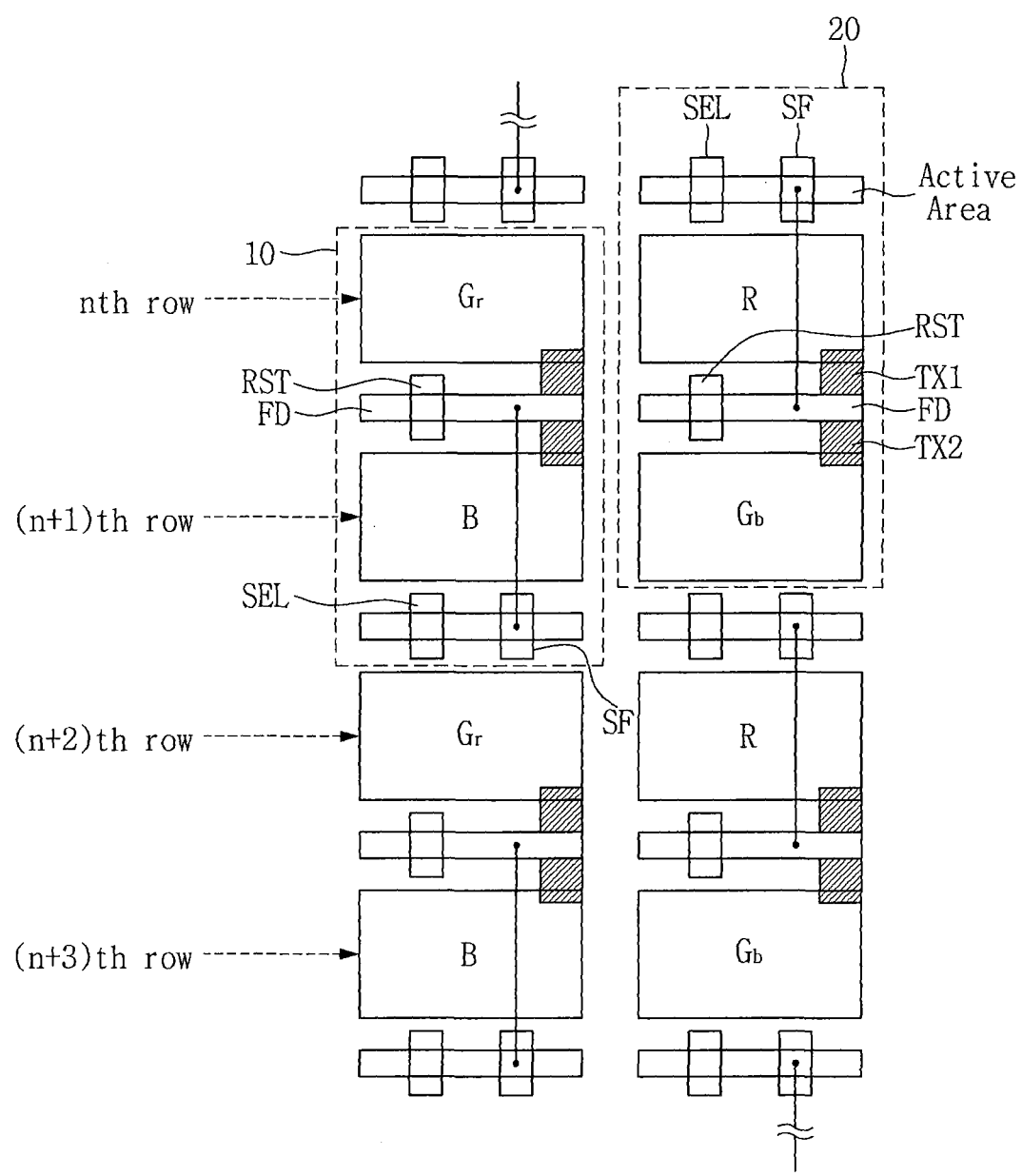
FIG. 5 is a plan view illustrating a layout of a pixel array and drive circuit in accordance with an embodiment of the inventive concepts.

FIG. 5 is a plan view showing a layout of a pixel array and drive circuit in accordance with an embodiment of the inventive concepts. In the example embodiment of FIG. 5, the pixel drive circuit has a 4T-2 shared pixel structure (an example of which is shown in FIG. 3), but may exhibit reduced interference between pixels because of a modified layout of the conductive wirings.

Referring to FIG. 5, the pixels are disposed in rows and columns. That is, a Gr pixel and an R pixel are disposed in an $n^{th}$ row, and a B pixel and a Gb pixel are disposed in an $(n+1)^{th}$ row. A Gr pixel and an R pixel are disposed in a $(n+2)^{th}$ row, and a B pixel and a Gb pixel are disposed in an $(n+3)^{th}$ row.

Each even-numbered column in the array may have the configuration of the left-side column of FIG. 5. The pixels are connected to have a vertical shared structure column by column. In other words, an upper pixel and a lower pixel that are disposed in different rows are connected to each other as a shared structure. For example, as shown in region labeled 10 in FIG. 5, the Gr pixel and the R pixel are formed as a shared structure.

As shown in FIG. 5, in an example embodiment of the inventive concepts, a structure connected to apply a signal received from a source follower transistor SF, which is disposed in a lower section of a first column and in an upper section of a second, adjacent column, based on an intermediate area between two rows, that is, an interposed area, is disclosed.

A floating diffusion area FD is formed between adjacent pixels in the column, and a reset transistor RST that is connected to the floating diffusion area FD is disposed below the Gr pixel. The Gr pixel and the floating diffusion area FD may be electrically connected to each other by a first transfer transistor TX1. A selection transistor SEL and a source follower transistor SF may be disposed on an active area below the B pixel. The source follower transistor SF may be electrically connected to the floating diffusion area FD by a conductive (e.g., metal) wiring. The Gr pixel and the B pixel overlap the first transfer transistor TX1 and a second transfer transistor TX2, respectively (although such overlap is not required, as discussed above). The first transfer transistor TX1 and the second transfer transistor TX2 are each connected to the floating diffusion area FD. The Gr pixel and the B pixel are disposed in different rows. The source follower transistor SF is connected to the floating diffusion area FD by a conductive (e.g., metal) wiring.

As shown in FIG. 5, the source follower transistor SF is disposed below the B pixel in the even-numbered column, while the source follower transistor SF is disposed above the R pixel in the adjacent odd-numbered column (see region 20 in FIG. 5). Accordingly, when pixels from the same row are activated, the activated source follower transistors SF are disposed so that locations thereof have a diagonal symmetry, and are connected to the floating diffusion areas FD, respectively.

Thus, in the even-numbered columns, the source follower transistors SF are not disposed in the area between an upper pixel and a lower pixel, but instead are disposed below the lower pixel. A conductive wiring connects each source follower transistor SF in an even-numbered column to the floating diffusion area FD. Since the source follower transistors SF for adjacent pixels in the column are spaced apart from each other, interference between adjacent pixels may be reduced.

Referring again to region 20 of FIG. 5, it can be seen that in the odd-numbered columns the upper R pixel and the lower Gb pixel have a shared structure, with the source follower transistor SF disposed above the upper pixel. That is, an active area is formed above the R pixel, and a selection transistor SEL and a source follower transistor SF are disposed in the active area. The source follower transistor SF and a floating diffusion area FD are connected by a conductive (e.g., metal) wiring so that the source follower transistor SF and the floating diffusion area FD are shared between the R pixel and the Gb pixel.

As is readily apparent from FIG. 5, according to some embodiments of the inventive concepts, image sensors are provided that have a pixel array that has a first column of pixels that includes a first pixel (e.g., the Gr pixel in region 10) and a second pixel (e.g., the B pixel in region 10) that are adjacent each other in a column direction. These first and second pixels share a first source follower transistor (e.g., the source follower transistor in the lower section of region 10). The pixel array includes a second column of pixels that has a third pixel (e.g., pixel R in region 20) and a fourth pixel (e.g., pixel Gb in region 20) that are adjacent each other in the column direction. The second column of pixels is adjacent the first column of pixels and arranged so that the first and third pixels (e.g., the Gr pixel and the R pixel) form a first row in a row direction that is substantially perpendicular to the column direction and the second and fourth pixels (e.g., the B pixel and the Gb pixel) form a second row in the row direction. The third and fourth pixels share a second source follower transistor (e.g., the source follower transistor in the upper section of region 20). The first source follower transistor is diagonally spaced apart from the second source follower transistor with respect to the array defined by the first and second rows and the first and second columns.

As can also be seen from FIG. 5, according to further embodiments of the inventive concepts, image sensors are provided that include a first pixel (e.g., pixel Gr in region 10) and a second pixel (e.g., pixel B in region 10) which are sequentially disposed in a first column that extends in a column direction and a third pixel (e.g., pixel R in region 20) and a fourth pixel (e.g., pixel Gb in region 20) which are sequentially disposed in a second column that extends in the column direction. The first pixel is directly adjacent the third pixel in a first row that extends in a row direction that is substantially perpendicular to the column direction and the second pixel is directly adjacent the fourth pixel in a second row that extends in the row direction. A first source follower transistor is disposed in the first column that is positioned above both the first pixel and the second pixel (i.e., the source follower transistor that is depicted above region 10 at the top of FIG. 5) and a second source follower transistor is provided in the first column that is positioned below both the first pixel and the second pixel (i.e., the source follower transistor that is in region 10). A third source follower transistor is provided in the second column that is positioned above both the third pixel and the fourth pixel (i.e., the source follower transistor that is provided in region 20), and a fourth source follower transistor is provided in the second column that is positioned below both the third pixel and the fourth pixel (i.e., the source follower transistor in the right-hand column that is in the same row as the source follower transistor in region 10). The first and third source follower transistors are connected so that driving times thereof are differently controlled and the second and fourth source follower transistors are connected so that driving times thereof are differently controlled.

As can also be seen from FIG. 5, according to still further embodiments of the inventive concepts, image sensors are provided that have a pixel array that includes a plurality of pixels that are arranged in rows and columns and a plurality of source follower transistors, each of which is associated with one or more of the pixels. For example, in the embodiment of FIG. 5, the Gr pixel and the B pixel in region 10 are associated with the source follower transistor SF that is located in the lower portion of region 10, and the R pixel and the Gb pixel in region 20 are associated with the source follower transistor SF that is located in the upper portion of region 20. Ones of the source follower transistors that are associated with pixels in odd columns (here, the left-hand column in FIG. 5) of a first row are below the pixels in the first row and ones of the source follower transistors that are associated with pixels in even columns (here, the right-hand column in FIG. 5) of the first row are above the pixels in the first row. It will be appreciated that the terms "odd column" and "even column" are used broadly to refer to alternating columns in the pixel array as opposed to requiring that the columns be numbered starting from the left-hand side of the array. Thus, it will be appreciated, for example, that the next to left-most column in an array may be termed either an "odd column" or an "even column" as the array can be defined to include the left most column (in which case the next to left-most column would be an even column) or to not include the left-most column (in which case the next to left-most column would be an odd column).

Figure 6A:
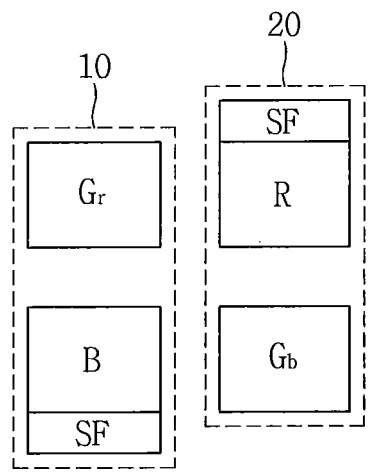
FIGS. 6A and 6B are schematic views illustrating the layout of the pixel drive circuit of FIG. 5.
Figure 6B:

FIGS. 6A and 6B are schematic views illustrating the basic configuration of regions 10 and 20 of FIG. 5.

When representing some of pixels connected as a structure shared by an even-numbered column and an odd-number column, it shows a mirror symmetry based on the horizontal axis.

Referring to FIG. 6A, four pixels of the array are shown, including a Gr pixel and a B pixel that are disposed in an even-numbered column 10 and an R pixel and a Gb pixel that are disposed in an odd-numbered column 20. A first source follower transistor SF is disposed below the lower pixel in the even-numbered column 10, and a second source follower transistor SF is disposed above the upper pixel in the odd-numbered column 20.

While it is exemplified for convenience of description that the source follower transistors SF are disposed below the pixels in the even-numbered column 10, and above the pixels in the odd-numbered column 20, it will be appreciated that this configuration may be reversed.

FIG. 6B shows this disposition as a more simple alignment mark.

Operation of the pixel drive circuit of FIG. 5 will now be described.

When an $n^{th}$ row is selected, the Gr pixel and the R pixel in the $n^{th}$ row may be activated. Signals of the Gr pixel and the R pixel may be photoelectrically converted and transferred through the respective transfer transistors, and the transferred signals may charge the respective floating diffusion areas FD. Continuously, signals amplified through the source follower transistors SF may be output through the selection transistors SEL.

Here, in accordance with the embodiment of the inventive concepts, a distance between the activated source follower transistors SF is relatively large. Therefore, interference between the adjacent pixels may be reduced.

Describing again, as the source follower transistors SF activated between adjacent pixels in a row that are selected at the same time are disposed so that a distance therebetween is increased, an influence of parasitic capacitance between the adjacent pixels may be reduced. Further, since overlapping areas (based on the horizontal direction in FIG. 5) of the conductive wirings between the source follower transistor SF and the floating diffusion area FD are also reduced, an influence of coupling capacitance between the wirings may be reduced.

In accordance with another aspect, driving times of the source follower transistors SF for adjacent pixels in a row may be controlled to be different. Therefore, when a certain row is selected and activated, since the source follower transistors SF adjacently disposed on the same line are not activated, but the source follower transistors SF disposed on different locations are activated, an influence of a distance between the adjacent pixels may be reduced.

As described above, a photo diode, that is, an electric charge photoelectrically converted from the pixel, charges a floating diffusion area FD, and the source follower transistor SF amplifies the charged electric charge, and thus, each pixel voltage may be represented, and each pixel voltage is displayed as a visible color through a color filter.

Therefore, an influence of capacitance of the floating diffusion area FD should be minimized, and then an expected voltage may be output with reduced distortion.

$$\Delta V = \frac{\Delta Q}{C} \quad \text{[Equation 1]}$$

($\Delta V$ is a voltage variation in a floating diffusion area FD, C is a capacitance of the floating diffusion area FD, and $\Delta Q$ is an electric charge variation in the floating diffusion area FD.)

As shown in Equation 1, as a capacitance of the floating diffusion area FD remains constant, a desired and expected voltage may be obtained.

Figure 7:
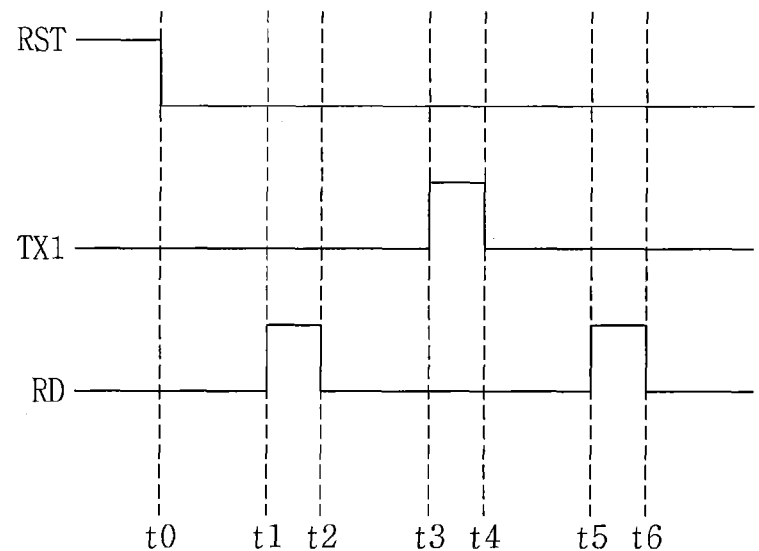
FIG. 7 is a timing diagram of a process for obtaining a value of ΔV in Equation 1.

FIG. 7 is a timing diagram to help understanding a process of obtaining a $\Delta V$ in Equation 1.

Referring to FIG. 7, a reset signal RST is reset, and then deactivated at time to.

Next, before a first drive signal TX1 is activated, a read signal RD is activated at time t1, and a voltage of the floating diffusion area FD is read.

The first drive signal TX1 is activated at time t3, and then the read signal RD is activated again at time t5, and the voltage of the floating diffusion area FD is read again.

While activating the reset signal, the floating diffusion area FD is being charged with a pixel power source, and then, during the second reading, the floating diffusion area FD reads a voltage photoelectrically converted from a photo diode.

When a voltage (at time t1) reset by the rest signal RST is referred to as V1, and a voltage at the second reading (at time t5) is referred to as V2, $\Delta V$ is the same as the following equation.

$$\Delta V = V1 - V2 \quad \text{[Equation 2]}$$

As shown in Equation 1, when $\Delta V$ is referred to as an expected voltage, the capacitance of the floating diffusion area FD should remain constant without variation, and then a desired voltage may be output.

Therefore, in the embodiment of the inventive concepts, it is desired that the source follower transistors SF that are activated simultaneously are disposed farther apart so that interference of the capacitance of the floating diffusion area FD is reduced, and an overlapping area between metal wirings that are connected thereto is reduced.

In accordance with the embodiment of the inventive concepts, the disposition of the pixels may be conventional, but the connections between the source follower transistors SF and the floating diffusion area FD are arranged differently, that is, as a location of each source follower transistor SF being activated is controlled to be different, and thus, an influence of parasitic capacitance between adjacent pixels may be reduced. Therefore, the pixels may be maintained at a more constant voltage, and high-resolution pixels may be provided.

In the embodiment of the inventive concepts, while the source follower transistors SF that are activated at the same time are disposed below the lower pixel in the even-numbered columns and above the upper pixels in the odd-numbered columns, it is not limited thereto. On the contrary, it is not excluded that the source follower transistors SF being activated at the same time are disposed to be located above the upper pixel in an even-numbered column, and below the lower pixel in an odd-numbered column. In the case of selecting the same row, when the source follower transistors SF that are activated at the same time are not disposed side-by-side, and instead are disposed to be farther apart according to a predetermined rule, the scope of the inventive concepts may be satisfied.

In accordance with the embodiment of the inventive concepts, the pixels and the transistors of the conventional structure need not be modified, and only a connection wiring between the source follower transistor SF and the floating diffusion area FD may be modified, and thus, it is easy to modify the layout. Further, since additional circuits and processes are not required, an additional cost burden is low.

Figure 8:
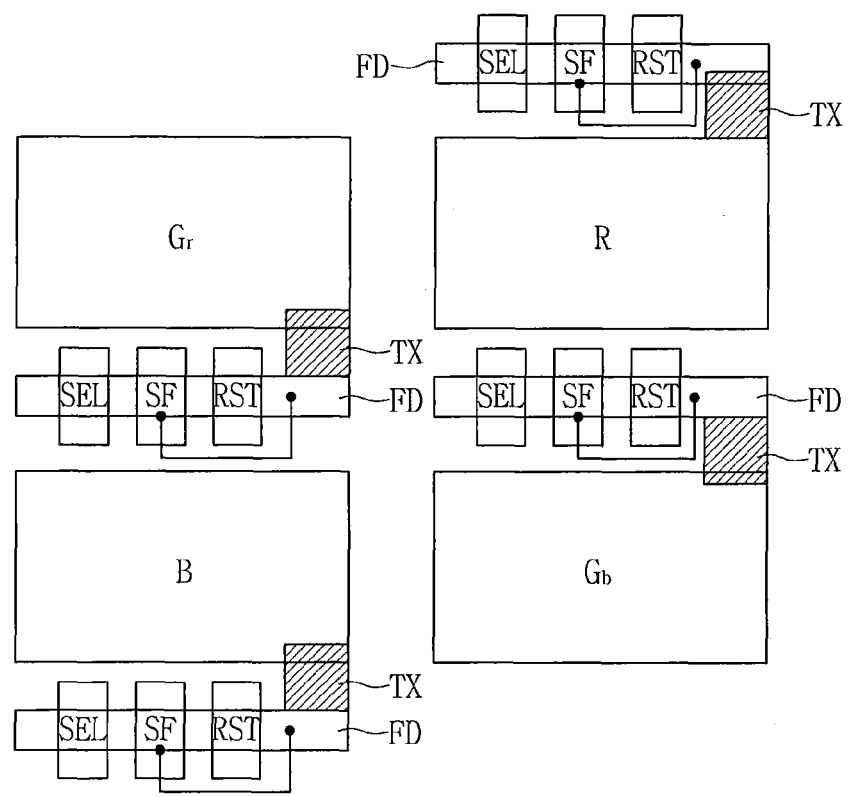
FIG. 8 is a plan view illustrating a layout of a pixel drive circuit in accordance with another embodiment of the inventive concepts.

FIG. 8 is a plan view of illustrating the layout of a pixel array and drive circuit having the 4T structure shown in FIG. 2 accordance with another embodiment of the inventive concepts.

Referring to FIG. 8, a Gr pixel and an R pixel are disposed in a first row.

First, referring to the Gr pixel, a floating diffusion area FD, a selection transistor SEL, a source follower transistor SF, and a reset transistor RST are formed below the Gr pixel. The source follower transistor SF and the floating diffusion area FD of the Gr pixel are electrically connected.

Referring to the R pixel that is in the same row as the Gr pixel, a floating diffusion area FD, a selection transistor SEL, a source follower transistor SF, and a reset transistor RST are formed above the R pixel. The source follower transistor SF and the floating diffusion area FD of the R pixel are electrically wired.

Figure 9A:
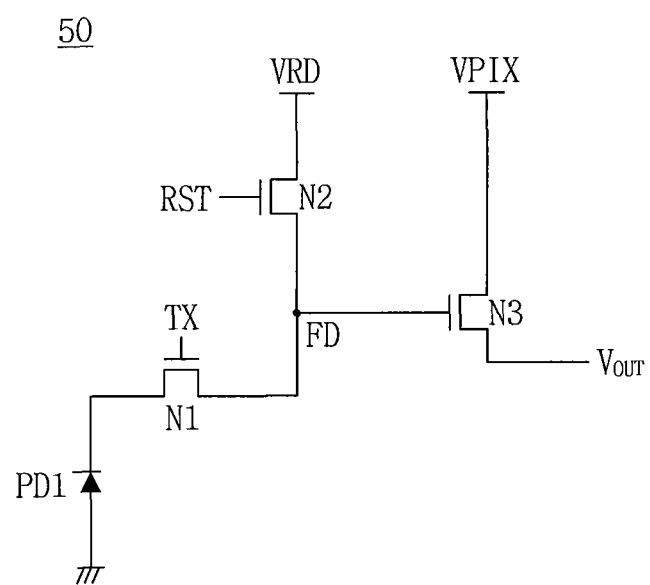
FIGS. 9A and 9B are, respectively, a circuit diagram showing a pixel and its associated drive circuit and a plan view showing a layout of a pixel array and drive circuit in accordance with still another embodiment of the inventive concepts.
Figure 9B:
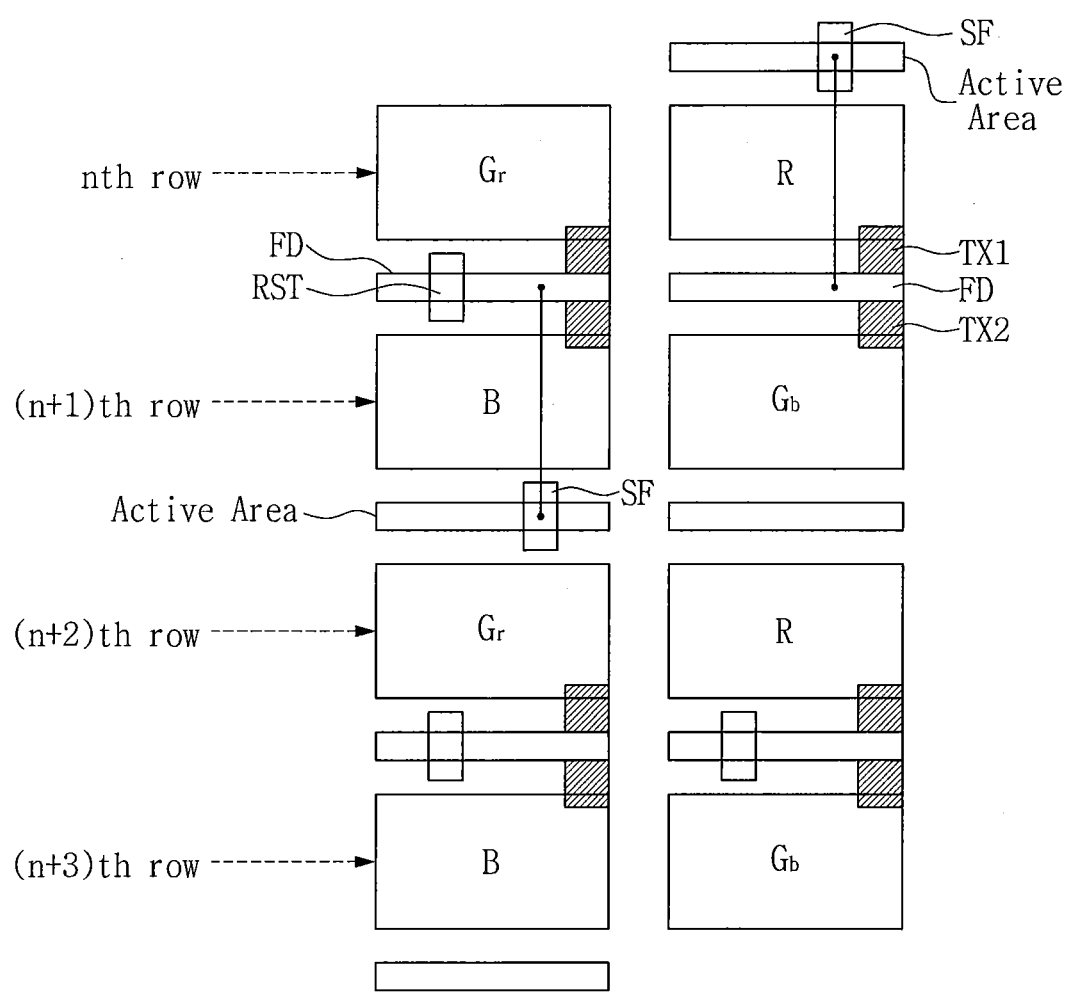

Therefore, the selected source follower transistors SF activated from the same row are not located on the same line but instead are disposed far away from each other, and thus, overlapping areas of the metal wirings of the floating diffusion areas FD may be also reduced FIGS. 9A and 9B are respectively a circuit diagram illustrating a pixel and its associated drive circuit and a plan view showing a layout of a pixel array and drive circuit in accordance with another embodiment of the inventive concepts.

FIG. 9A is a circuit diagram of a pixel drive circuit 50 having a 3T (3 transistors) structure. The pixel drive circuit 50 having the 3T structure excludes the conventional selection transistor N4 (shown in FIG. 2), and the selection transistor is replaced by controlling a reset transistor RST as a read voltage VRD.

Referring to FIG. 9A, the pixel drive circuit 50 having a 3T structure includes a photo diode PD1, a transfer transistor N1, a reset transistor N2, and a source follower transistor N3.

The photo diode PD1 is electrically connected to the transfer transistor N1.

The transfer transistor N1 is controlled by a drive signal TX, and transfers a signal, which is photoelectrically converted from the photo diode PD1, to a floating diffusion area FD.

The reset transistor N2 is electrically connected to the floating diffusion area FD, and controlled by a reset signal RST. Specifically, the drain voltage VRD of the reset transistor N2 is controlled row by row to serve as a selection transistor when needed.

The source follower transistor N3 amplifies an electric charge of the floating diffusion area FD, and provides the amplified electric charge as an output voltage $V_{out}$.

FIG. 9B is a layout related to FIG. 9A, and a plan view of a layout of a 3T-2 shared pixel structure.

Since the layout has the 3T structure, the number of transistors shared by two pixels is 3.

First, a Gr pixel and an R pixel are adjacently disposed in a first row.

A floating diffusion area FD is disposed below the Gr pixel, and a first transfer transistor TX1 is disposed to overlap the Gr pixel. Further, a reset transistor RST is disposed in the floating diffusion area FD. An active area is formed above the R pixel, and a source follower transistor SF is formed in the active area. The R pixel and another first transfer transistor TX1 are disposed to overlap. A floating diffusion area FD is disposed below the R pixel. The source follower transistor SF that is above the R pixel is electrically wired and connected to the floating diffusion area FD.

A B pixel is located in the same column as the Gr pixel. The B pixel includes a source follower transistor SF disposed in an active area that is below the B pixel that is wired and electrically connected to the floating diffusion area FD that is below the Gr pixel.

As described above, since the source follower transistors SF between adjacent pixels, which are selected from the same row, are disposed to be activated at different locations in various cases, capacitance influence between the adjacent pixels may be reduced.

The image sensor in accordance with each embodiment may be applied to various multimedia devices including image recording functions.

Figure 10A:
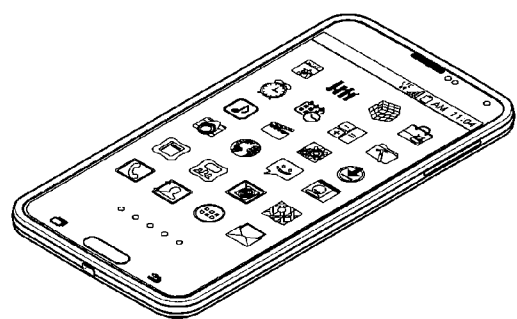
FIG. 10A is a schematic view of a smart phone that includes the image sensor of FIG. 5.
Figure 10B:
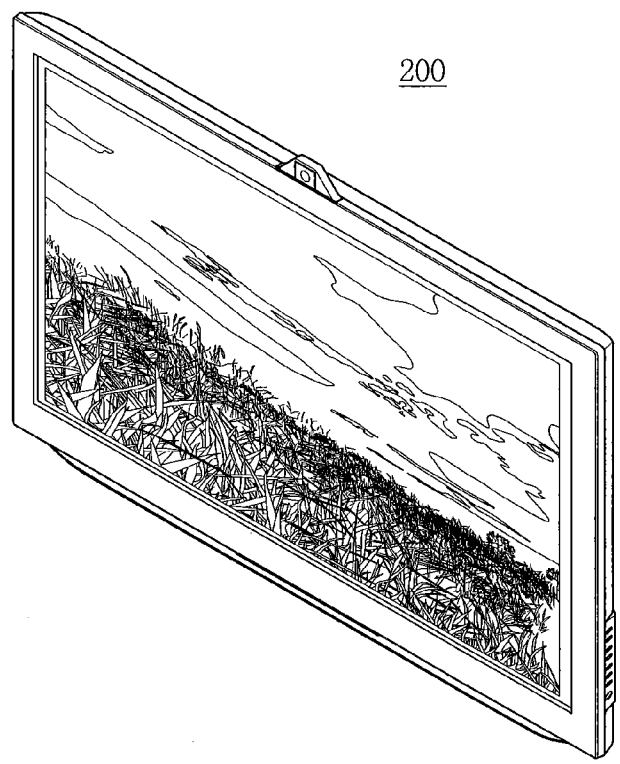
FIG. 10B is a schematic view of a smart TV that includes the image sensor of FIG. 5.
Figure 10C:
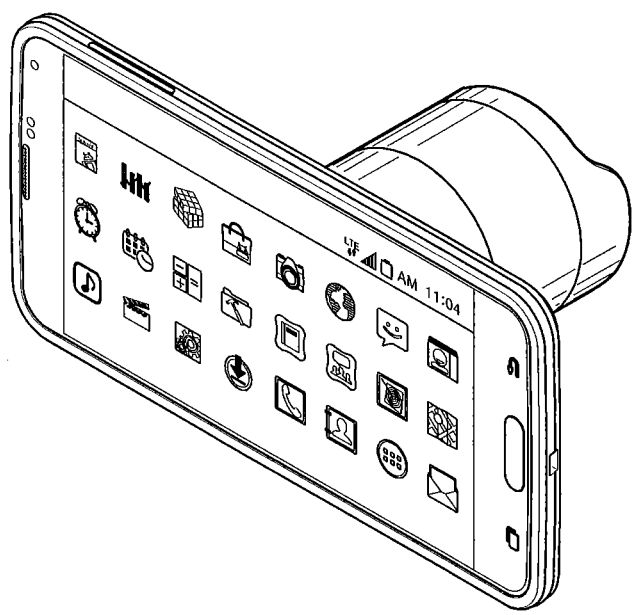
FIG. 10C is a schematic view of a digital camera that includes the image sensor of FIG. 5.

FIGS. 10A to 10C are schematic views showing examples of multimedia devices in which the image sensors in accordance with the embodiments of inventive concepts may be applied.

FIG. 10A shows a smart phone 100, and FIG. 10B shows a smart TV 200.

A high-resolution image sensor is mounted in various products such as a smart phone, a tablet PC, a smart TV, and the like. Therefore, the image sensor in accordance with embodiments of the inventive concepts may be mounted in the smart phone 100 or the smart TV 200.

FIG. 10C shows a digital camera 300. The image sensors in accordance with embodiments of the inventive concepts may be applied to the digital camera having the image sensor as shown in FIG. 10C. Referring to FIG. 10C, the digital camera 300 may include an image sensor capable of capturing an image or a video, and a display device capable of displaying an image or a video to be shot.

Since the source follower transistors, which are activated between adjacent pixels, are disposed so that locations thereof have a diagonal symmetry, the image sensors in accordance with embodiments of the inventive concepts may exhibit reduced interference between the pixels.

The inventive concepts can be applied to a memory device, and specifically, a liquid crystal display (LCD) device and a memory system including the same.

While the example embodiments of the inventive concepts and their advantages have been described in detail, it should be understood that various changes, substitutions, and alterations may be made herein without departing from the scope of the inventive concepts as defined by the following claims.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An image sensor, comprising:
a first column of pixels that includes a first pixel and a second pixel that are adjacent each other in a column direction;
a first source follower transistor that is shared by the first pixel and the second pixel;
a second column of pixels that includes a third pixel and a fourth pixel that are adjacent each other in the column direction, the second column of pixels being adjacent the first column of pixels so that the first and third pixels form a first row in a row direction that is substantially perpendicular to the column direction and the second and fourth pixels form a second row in the row direction;
a second source follower transistor that is shared by the third pixel and the fourth pixel,
wherein the first source follower transistor is diagonally spaced apart from the second source follower transistor with respect to an array defined by the first and second rows and the first and second columns,
wherein the first source follower transistor is disposed below the second pixel and the second source follower transistor is disposed above the third pixel or the first source follower transistor is disposed above the first pixel and the second source follower transistor is disposed below the fourth pixel.

2. The image sensor according to claim 1, further comprising a first floating diffusion area that is between the first pixel and the second pixel.

3. The image sensor according to claim 2, wherein the first source follower transistor is electrically connected to the first floating diffusion area.

4. The image sensor according to claim 3, further comprising a second floating diffusion area that is between the third pixel and the fourth pixel.

5. The image sensor according to claim 4, wherein the second source follower transistor is electrically connected to the second floating diffusion area.

6. An image sensor, comprising:
a first pixel and a second pixel which are sequentially disposed in a first column that extends in a column direction;
a third pixel and a fourth pixel which are sequentially disposed in a second column that extends in the column direction, the first pixel adjacent the third pixel in a first row that extends in a row direction that is substantially perpendicular to the column direction and the second pixel adjacent the fourth pixel in a second row that extends in the row direction;
a first source follower transistor in the first column that is positioned above both the first pixel and the second pixel;
a second source follower transistor in the first column that is positioned below both the first pixel and the second pixel;
a third source follower transistor in the second column that is positioned above both the third pixel and the fourth pixel;
a fourth source follower transistor in the second column that is positioned below both the third pixel and the fourth pixel;
wherein the first and third source follower transistors are connected so that driving times thereof are differently controlled and the second and fourth source follower transistors are connected so that driving times thereof are differently controlled.

7. The image sensor according to claim 6, wherein when either of the first pixel or the second pixel is activated, the first source follower transistor is activated, and when either of the third pixel or the fourth pixel is activated, the fourth source follower transistor is activated.

8. The image sensor according to claim 7, wherein the first pixel and the second pixel are connected to share the first source follower transistor, and the third pixel and the fourth pixel are connected to share the fourth source follower transistor.

9. The image sensor according to claim 6, wherein when either of the first pixel and the second pixel are activated, the second source follower transistor is activated, and when either of the third pixel and the fourth pixel are activated, the third source follower transistor is activated.

10. The image sensor according to claim 9, wherein the first pixel and the second pixel are connected to share the second source follower transistor, and the third pixel and the fourth pixel are connected to share the third source follower transistor.

11. The image sensor according to claim 6, wherein when pixels selected from the same row are activated, the ones of the first through fourth source follower transistors that are activated are disposed so that locations thereof have a diagonal symmetry.

12. The image sensor of claim 6, wherein the first source follower transistor is connected to a first floating diffusion area by a first conductive line that extends in the column direction along the first column, the second source follower transistor is connected to a second floating diffusion area by a second conductive line that extends in the column direction along the first column, the third source follower transistor is connected to a third floating diffusion area by a third conductive line that extends in the column direction along the second column, and the fourth source follower transistor is connected to a fourth floating diffusion area by a fourth conductive line that extends in the column direction along the second column, wherein the first and third conductive lines do not substantially overlap with either the second or fourth conductive lines in the row direction.

13. An image sensor, comprising:
a first column of pixels that includes a first pixel and a second pixel that are adjacent each other in a column direction;
a first source follower transistor that is shared by the first pixel and the second pixel;
a second column of pixels that includes a third pixel and a fourth pixel that are adjacent each other in the column direction, the second column of pixels being adjacent the first column of pixels so that the first and third pixels form a first row in a row direction that is substantially perpendicular to the column direction and the second and fourth pixels form a second row in the row direction;
a second source follower transistor that is shared by the third pixel and the fourth pixel;
a first floating diffusion area that is between the first pixel and the second pixel; and
a second floating diffusion area that is between the third pixel and the fourth pixel,
wherein the first source follower transistor is diagonally spaced apart from the second source follower transistor with respect to an array defined by the first and second rows and the first and second columns,
wherein the first source follower transistor that has a gate that is electrically connected to the first floating diffusion area by a first conductive line, and
wherein the second source follower transistor has a gate that is electrically connected to the second floating diffusion area by a second conductive line that is spaced apart from the first conductive line in both the row direction and the column direction.

14. The image sensor of claim 13, wherein the first and second conductive lines are part of a plurality of conductive lines are arranged in a diagonal pattern.

* * * * *